US009997852B2

(12) United States Patent
Chen

(10) Patent No.: US 9,997,852 B2
(45) Date of Patent: Jun. 12, 2018

(54) ELECTRICAL CONNECTOR HAVING POWER CONTACTS AND HOLDING MEMBERS ACTING AS ADDITIONAL POWER CONTACTS

(71) Applicant: FOXCONN INTERCONNECT TECHNOLOGY LIMITED, Grand Cayman (KY)

(72) Inventor: Ming-Ching Chen, New Taipei (TW)

(73) Assignee: FOXCONN INTERCONNECT TECHNOLOGY LIMITED, Grand Cayman (KY)

( * ) Notice: Subject to any disclaimer, the term of this patent is extended or adjusted under 35 U.S.C. 154(b) by 0 days. days.

(21) Appl. No.: 15/703,190

(22) Filed: Sep. 13, 2017

(65) Prior Publication Data

US 2018/0076549 A1    Mar. 15, 2018

(30) Foreign Application Priority Data

Sep. 13, 2016  (CN) .......................... 2016 1 0819956

(51) Int. Cl.
| | |
|---|---|
| *H01R 12/00* | (2006.01) |
| *H01R 12/71* | (2011.01) |
| *H01R 24/60* | (2011.01) |
| *H01R 12/70* | (2011.01) |
| *H01R 107/00* | (2006.01) |

(52) U.S. Cl.
CPC ....... *H01R 12/716* (2013.01); *H01R 12/7082* (2013.01); *H01R 12/7088* (2013.01); *H01R 24/60* (2013.01); *H01R 2107/00* (2013.01)

(58) Field of Classification Search
CPC ................ H01R 23/725; H01R 23/722; H01R 23/7026; H01R 13/506
USPC ....................... 439/74, 71, 70, 330, 331, 525
See application file for complete search history.

(56) References Cited

U.S. PATENT DOCUMENTS

| | | | | |
|---|---|---|---|---|
| 4,495,380 A | * | 1/1985 | Ryan ..................... | F16B 21/082 174/138 D |
| 4,697,859 A | * | 10/1987 | Fisher, Jr. .......... | H01R 13/6315 439/246 |
| 7,210,941 B2 | * | 5/2007 | Rosenberger ...... | H01R 13/2464 439/63 |
| 7,901,218 B2 | | 3/2011 | Sato | |
| 8,360,789 B2 | * | 1/2013 | Yin ........................ | H01R 12/52 439/66 |
| 8,556,640 B2 | | 10/2013 | Mashiyama | |
| 8,845,339 B2 | | 9/2014 | Ono | |
| 9,331,410 B2 | | 5/2016 | Obikane | |
| 9,356,371 B2 | | 5/2016 | Goto | |
| 9,362,637 B2 | | 6/2016 | Hasegawa | |
| 9,666,963 B2 | | 5/2017 | He | |

(Continued)

FOREIGN PATENT DOCUMENTS

CN          105633673 A      6/2016

*Primary Examiner* — Phuong Chi T Nguyen

(74) *Attorney, Agent, or Firm* — Wei Te Chung; Ming Chieh Chang

(57) ABSTRACT

An electrical connector includes: an insulative housing; plural signal contacts secured to the insulative housing; plural power contacts secured to the insulative housing; and a pair of holding members secured to two opposite ends of the insulative housing, wherein the power contacts are disposed adjacent to the pair of holding members and the pair of holding members also act as power contacts.

8 Claims, 11 Drawing Sheets

(56) References Cited

U.S. PATENT DOCUMENTS

2004/0038586 A1\* 2/2004 Hall .................. H01R 13/6315
439/578

\* cited by examiner

ELECTRICAL CONNECTOR HAVING POWER CONTACTS AND HOLDING MEMBERS ACTING AS ADDITIONAL POWER CONTACTS

BACKGROUND OF THE INVENTION

1. Field of the Invention

The present invention relates to an electrical connector having separate power contacts and holding members with the latter also acting as power contacts.

2. Description of Related Art

U.S. Pat. No. 7,901,218 discloses an electrical connector including first and second fixtures each having at least three engaging or anchoring portions, respectively, that are engaged and therefore caused to be in electrical continuity, thereby using as power supply terminal.

U.S. Pat. No. 9,356,371 discloses a connector including wide terminals that can be connected to power lines and narrow terminals that can be connected to signal lines. The wide terminals are present on both sides of connector housing in longitudinal direction, heat is readily dissipated and does not build up inside the connector.

Connector power contacts of a different arrangement are desired.

SUMMARY OF THE INVENTION

An electrical connector comprises: an insulative housing; a plurality of signal contacts secured to the insulative housing; a plurality of power contacts secured to the insulative housing; and a pair of holding members secured to two opposite ends of the insulative housing; wherein the plurality of power contacts are disposed adjacent to the pair of holding members; and the pair of holding members act as power contacts.

DETAILED DESCRIPTION OF THE PREFERRED EMBODIMENT

Figure 1:
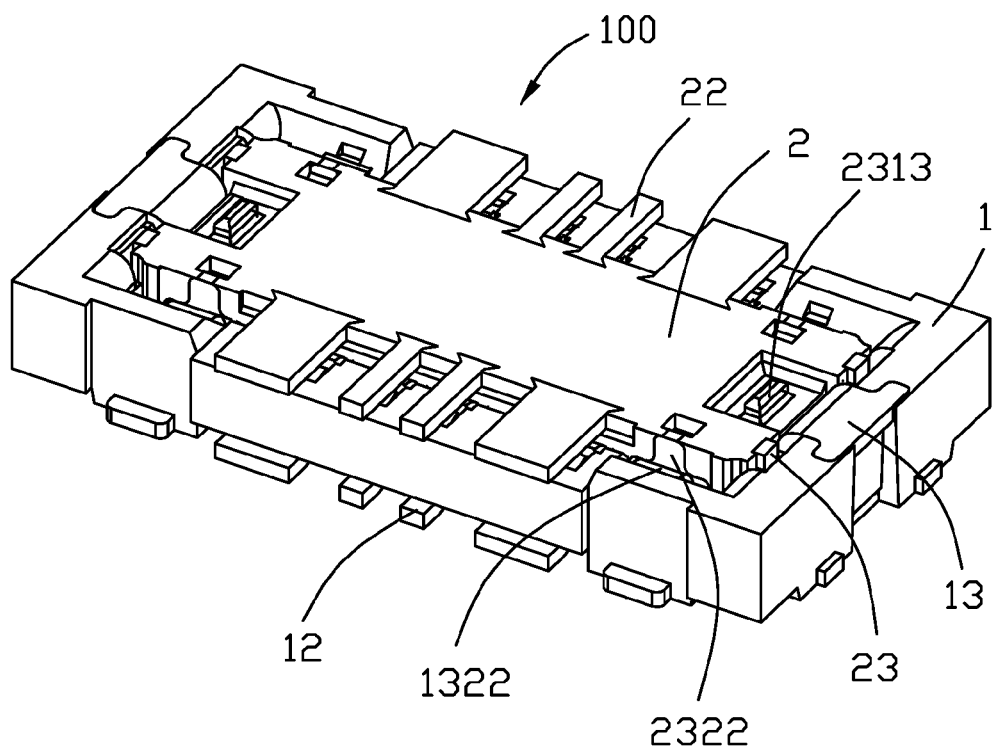
FIG. 1 is a perspective view of an electrical connector assembly in accordance with the present invention.
Figure 2:
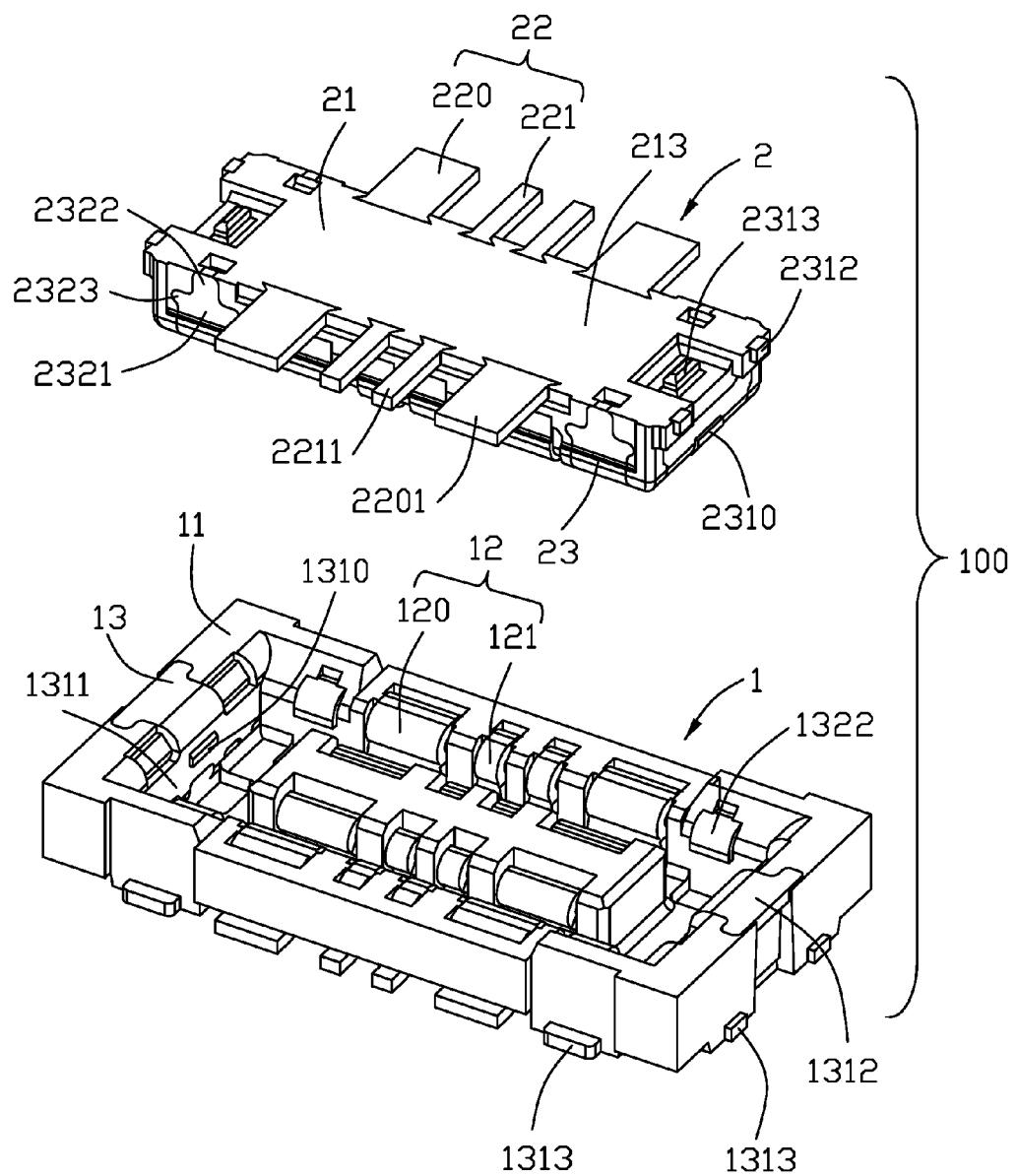
FIG. 2 is a perspective view of a plug connector and a receptacle connector of the electrical connector assembly.
Figure 3:
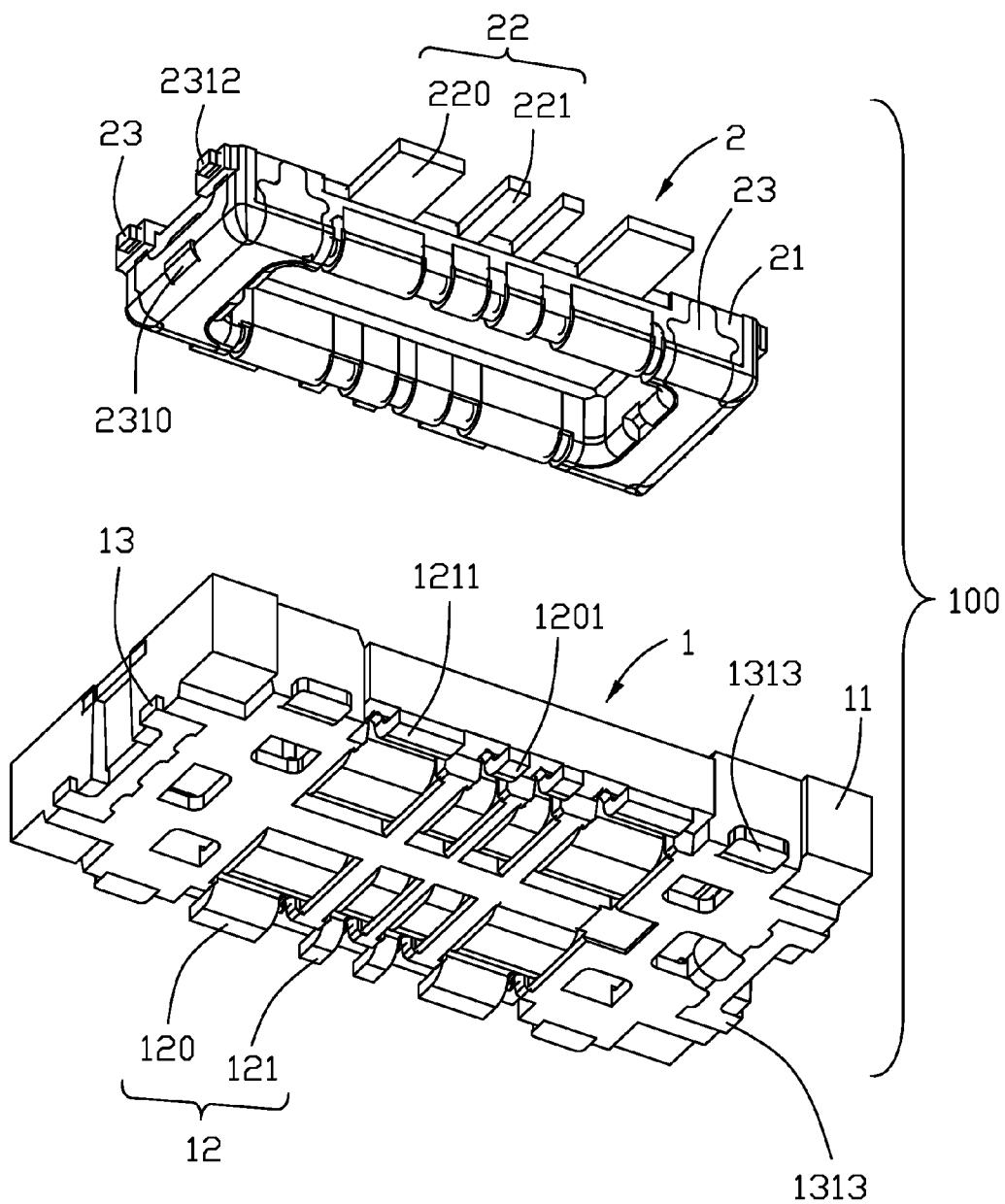
FIG. 3 is another perspective view of the plug connector and the receptacle connector.
Figure 4:
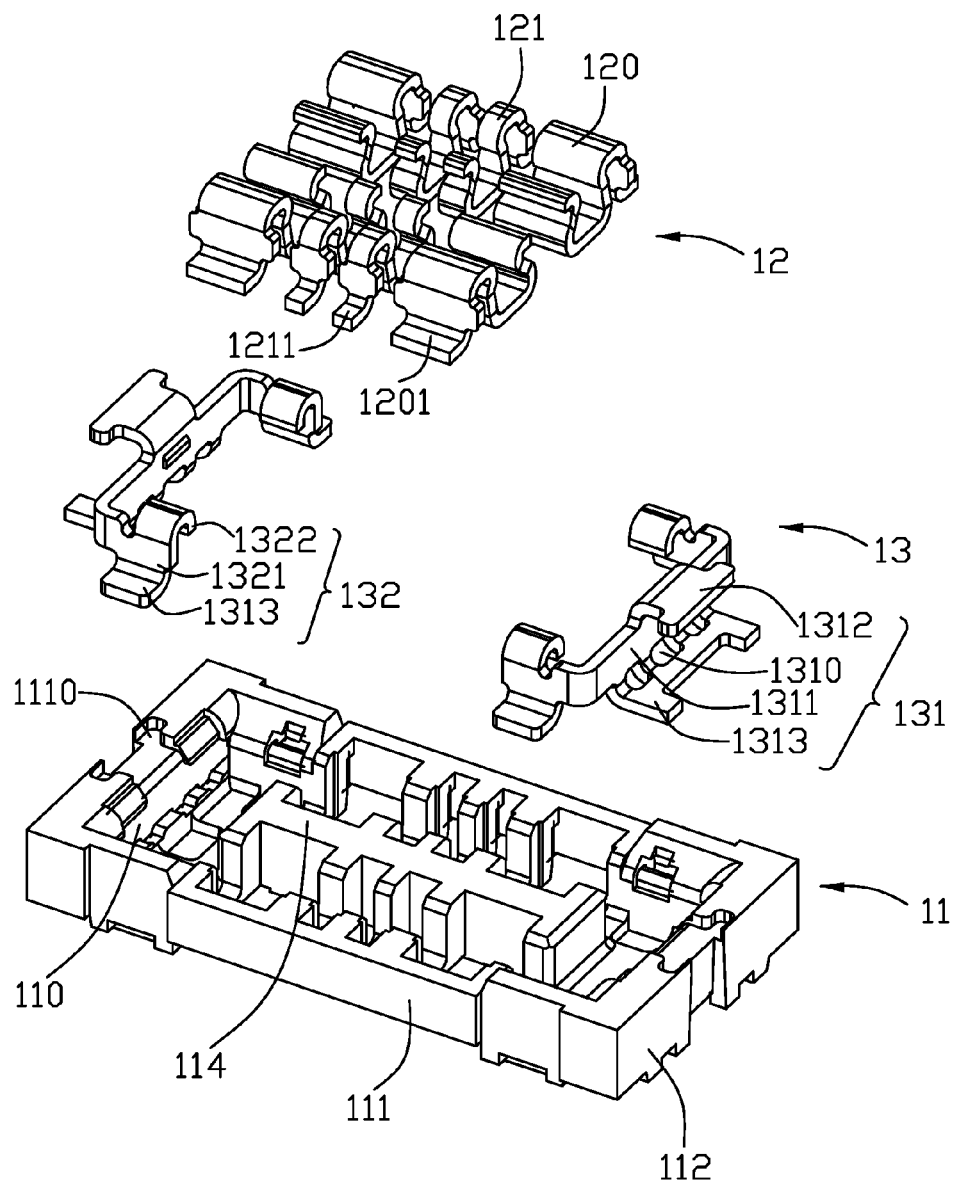
FIG. 4 is an exploded view of the receptacle connector.
Figure 5:
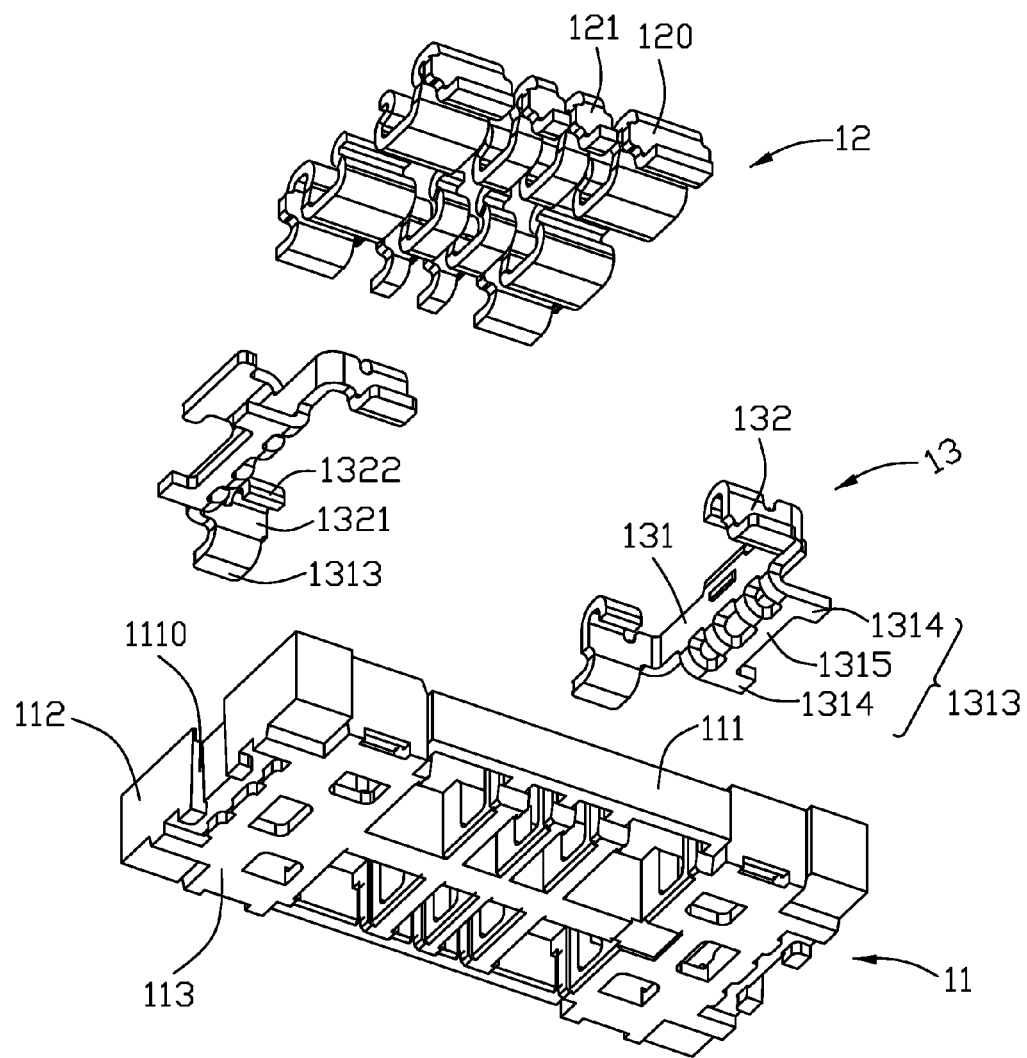
FIG. 5 is another exploded view of the receptacle connector.
Figure 6:
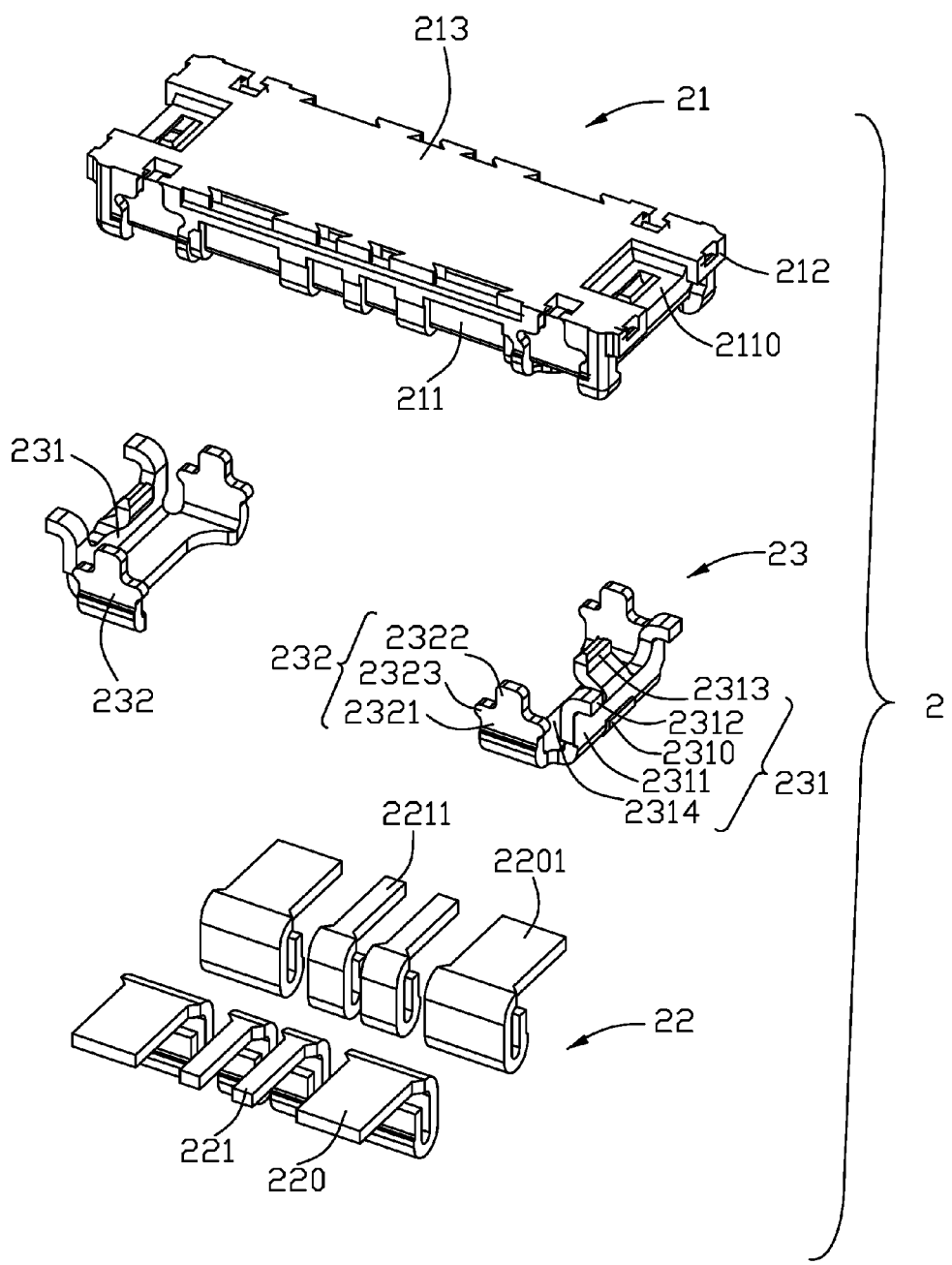
FIG. 6 is an exploded view of the plug connector.
Figure 7:
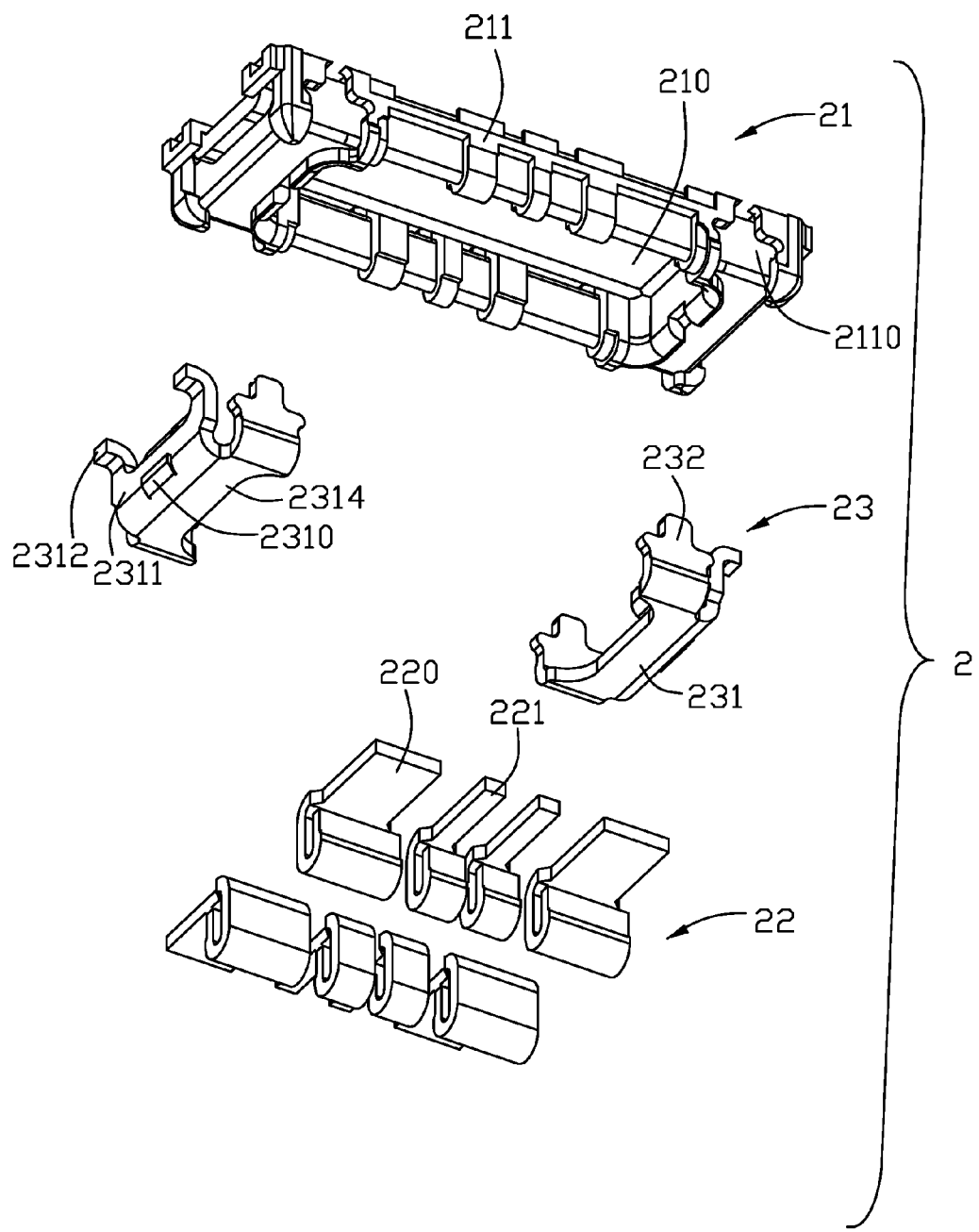
FIG. 7 is another exploded view of the plug connector.
Figure 8:
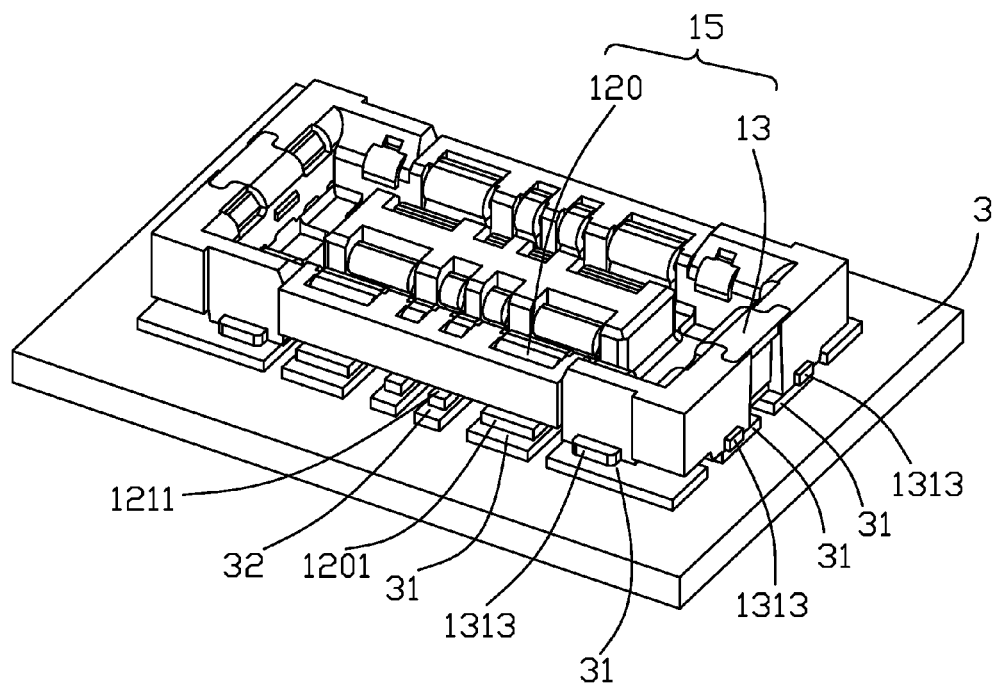
FIG. 8 is a perspective view of the receptacle connector mounted on a printed circuit board.
Figure 9:
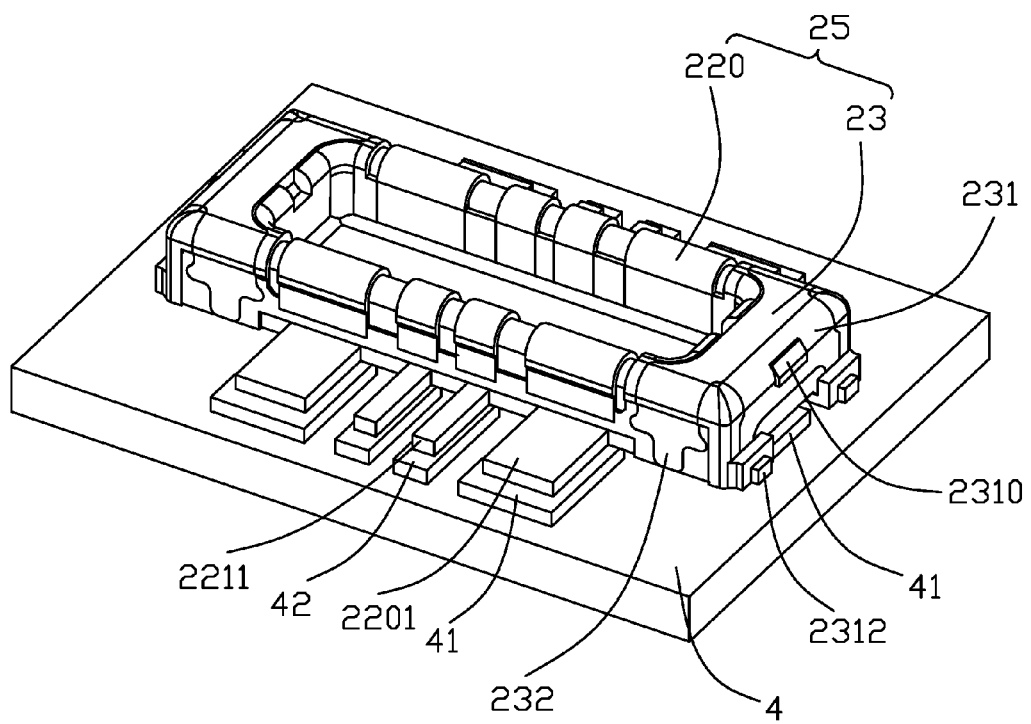
FIG. 9 is a perspective view of the plug connector mounted on another printed circuit board.
Figure 10:
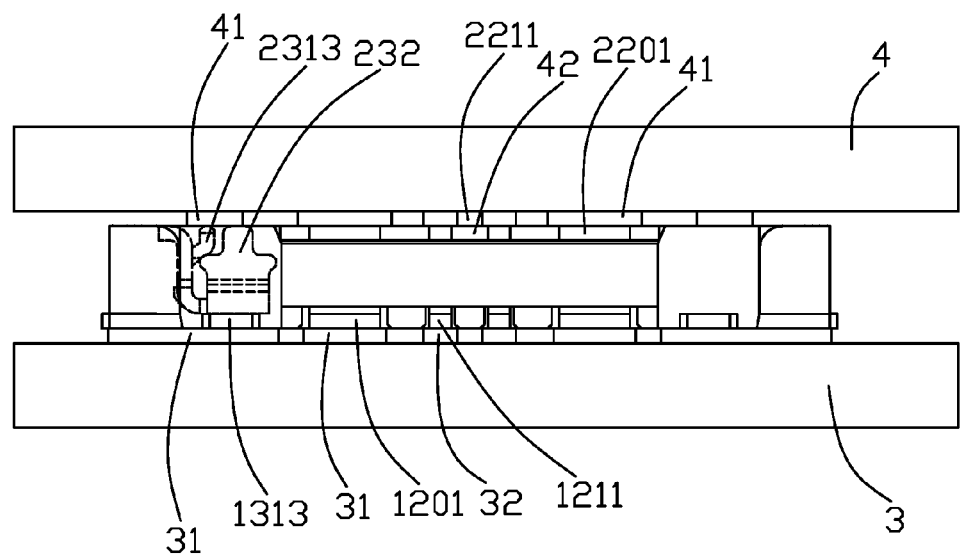
FIG. 10 is a front view of the receptacle connector and the plug connector mounted on respective printed circuit boards.
Figure 11:
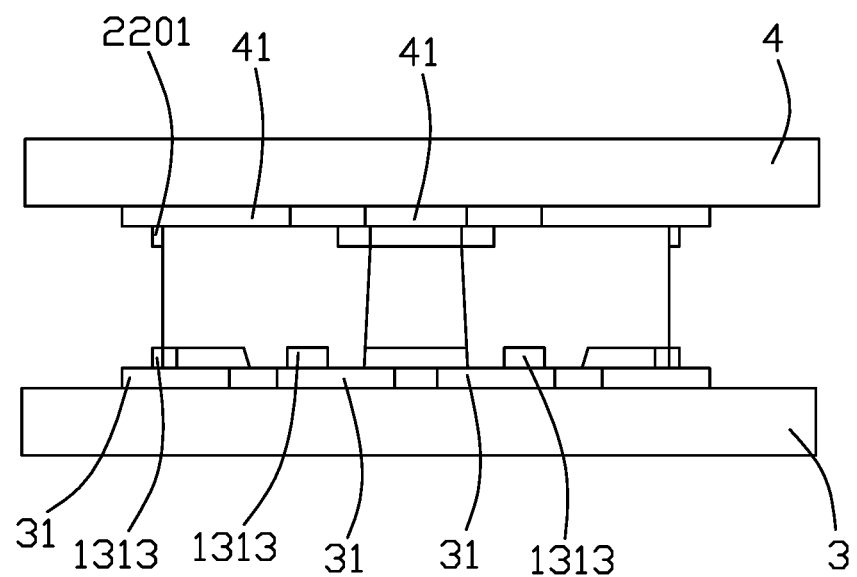
FIG. 11 is a side view of the receptacle connector and the plug connector mounted on respective printed circuit boards.

Referring to FIGS. 1 through 11, an electrical connector assembly 100 includes a receptacle connector 1 mounted on a printed circuit board (PCB) 3 and a mating plug connector 2 mounted on another PCB 4. The receptacle connector 1 includes an insulative housing 11, a plurality of contacts 12 secured to the insulative housing 11, and a pair of holding members 13 secured to two opposite ends of the insulative housing 11. The plurality of contacts 12 include plural power contacts 120 and plural signal contacts 121. A width of the power contact 120 is greater than a width of the signal contact 121. The plug connector 2 includes an insulative housing 21, a plurality of contacts 22 secured to the insulative housing 21, and a pair of holding members 23 secured to two opposite ends of the insulative housing 21. The plurality of contacts 22 include plural power contacts 220 and plural signal contacts 221. A width of the power contact 220 is greater than a width of the signal contact 221.

The insulative housing 11 has two opposing long side walls 111, two short end walls 112, a bottom wall 113, and a land 114 protruding from the bottom wall, together defining a receiving space 110 and plural contact-receiving grooves for accommodating corresponding contacts 12. Two receiving chambers 1110 are formed at two opposite ends of the insulative housing 11 for accommodating corresponding holding members 13.

The two holding members 13 are integrally formed with the insulative housing 11. Each holding member 13 has a base 131 and a pair of arms 132 bent from the base. The base 131 has a vertical planar portion 1311, a positioning portion 1312 extending outward from a top of the planar portion, a power contact portion 1313 extending outward from a bottom of the planar portion, and a latching hole 1310 for latching to the plug connector 2. The power contact portion 1313 includes two long contact legs 1314 and a connection 1315 between the two contact legs. The contact legs 1314 extend further outward than the connection 1315. Each arm 132 has an arm portion 1321, a positioning portion 1322 extending inward from a top of the arm portion, and a power contact portion 1313 extending outward from a bottom of the arm portion. The base 131 and the arms 132 are received in the chamber 1110 and inner surfaces of associated positioning portion 1312 and positioning portions 1322 thereof are exposed to the receiving space 110 for engaging a corresponding holding member 23.

In assembling, the holding members 13 are insert molded with the insulative housing 11, and the contacts 12 are inserted to the contact-receiving grooves of the insulative housing 11. The PCB 3 is provided with power pads 31 and signal pads 32. The power contact portions 1313 are soldered to the power pads 31. The power contact 120 has a tail 1201; the signal contact 121 has a tail 1211. The tails 1201 of the power contacts 120 are also soldered to the power pads 31. The tails 1211 of the signal contacts 121 are soldered to the signal pads 32.

The insulative housing 21 has two opposing side walls 211, two end walls 212, and a bottom wall 213, together defining a receiving space 210. The contacts 22 are secured to the two side walls 211. Two receiving chambers 2110 are formed at two opposite ends of the insulative housing 21 for accommodating corresponding holding members 23.

The two holding members 23 are integrally formed with the insulative housing 21. Each holding member 23 has a base 231 and a pair of arms 232 bent from the base. The base 231 has a vertical planar portion 2311, two positioning portions 2312 extending outward from a top of the planar portion, a power contact portion 2313 extending inward and upward from a top of the planar portion, a mounting portions 2314 extending inward from a bottom of the planar portion, and a latching block 2310 for latching to the receptacle connector 1. Each arm 232 has an arm portion 2321, a positioning portion 2322 extending upward from the arm portion, and two side protrusions 2323. An upper surface of the power contact portion 2313 is exposed through the bottom wall 213 for connection to the PCB 4. The base 231 and the arms 232 are received in the chamber 2110 and outer surfaces of associated planar portion 2311 and arms 232 thereof are exposed to exterior for engaging a corresponding holding member 13.

In assembling, the contacts 22 and the holding members 23 are insert molded with the insulative housing 11. The PCB 4 is provided with power pads 41 and signal pads 42. The power contact portions 2313 are soldered to the power pads 41. The power contact 220 has a tail 2201; the signal contact 221 has a tail 2211. The tails 2201 of the power contacts 220 are also soldered to the power pads 41. The tails 2211 of the signal contacts 221 are soldered to the signal pads 42.

What is claimed is:

1. An electrical connector comprising:
   an insulative housing defining a receiving space;
   a plurality of signal contacts secured to the insulative housing;
   a plurality of power contacts secured to the insulative housing; and
   a pair of holding members secured to two opposite ends of the insulative housing; wherein
   the plurality of power contacts are disposed adjacent to the pair of holding members; and
   the pair of holding members act as power contacts; wherein
   the two holding members are integrally formed with the insulative housing; each holding member has a base and a pair of arms bent from the base; the base has a vertical planar portion, a positioning portion extending outward from a top of the planar portion, a power contact portion extending outward from a bottom of the planar portion, and a latching hole for latching to a mating connector; the power contact portion includes two long contact legs and a connection between the two contact legs; the contact legs extend further outward than the connection; each arm has an arm portion, a positioning portion extending inward from a top of the arm portion, and a power contact portion extending outward from a bottom of the arm portion; and inner surfaces of the positioning portion of the base and the positioning portions of the two arms are exposed to the receiving space.

2. An electrical connector for mounting upon a printed circuit board, comprising:
   an insulative housing defining two opposite long side walls and two opposite short end walls perpendicular to each other;
   a plurality of signal contacts and power contacts secured to the corresponding side walls;
   a pair of holding members integrally formed with the corresponding end walls via an insert-molding process, respectively; wherein
   the holding members and the power contacts are electrically connected with each other via electrical traces on the printed circuit board so as to have the holding member function as additional power means; wherein
   the two holding members are integrally formed with the insulative housing; each holding member has a base and a pair of arms bent from the base; the base has a vertical planar portion, a positioning portion extending outward from a top of the planar portion, a power contact portion extending outward from a bottom of the planar portion, and a latching hole for latching to a mating connector; the power contact portion includes two long contact legs and a connection between the two contact legs; the contact legs extend further outward than the connection; each arm has an arm portion, a positioning portion extending inward from a top of the arm portion, and a power contact portion extending outward from a bottom of the arm portion; and inner surfaces of the positioning portion of the base and the positioning portions of the two arms are exposed to the receiving space.

3. The electrical connector as claimed in claim 2, wherein said signal contacts and said power contacts are integrally formed with the corresponding side walls via said insert-molding process.

4. The electrical connector as claimed in claim 2, wherein said holding members are dimensioned larger than both said signal contacts and said power contacts.

5. The electrical connector as claimed in claim 2, wherein said holding members are made by material different from those by which said signal contacts and said power contacts are made.

6. An electrical connector for mounting upon a printed circuit board, comprising:
   an insulative housing defining two opposite long side walls and two opposite short end walls perpendicular to each other;
   a plurality of signal contacts and power contacts secured to the corresponding side walls;
   a pair of holding members secured to the corresponding end walls, respectively; wherein
   the holding members and the power contacts are electrically connected with each other via electrical traces on the printed circuit board so as to have the holding member function as additional power means, and said holding member is thicker and wider than both the signal contacts and said power contacts; wherein
   the two holding members are integrally formed with the insulative housing; each holding member has a base and a pair of arms bent from the base; the base has a vertical planar portion, a positioning portion extending outward from a top of the planar portion, a power contact portion extending outward from a bottom of the planar portion, and a latching hole for latching to a mating connector; the power contact portion includes two long contact legs and a connection between the two contact legs; the contact legs extend further outward than the connection; each arm has an arm portion, a positioning portion extending inward from a top of the arm portion, and a power contact portion extending outward from a bottom of the arm portion; and inner surfaces of the positioning portion of the base and the positioning portions of the two arms are exposed to the receiving space.

7. The electrical connector as claimed in claim 6, wherein said holding members are made by material different from those by which said signal contacts and said power contacts are made.

8. The electrical connector as claimed in claim 6, wherein all the holding members and said signal contacts and said power contacts are integrally formed with the corresponding side walls via said insert-molding process.

* * * * *